United States Patent
Howard et al.

[11] Patent Number: 6,025,271
[45] Date of Patent: Feb. 15, 2000

[54] METHOD OF REMOVING SURFACE DEFECTS OR OTHER RECESSES DURING THE FORMATION OF A SEMICONDUCTOR DEVICE

[75] Inventors: Bradley J. Howard; Mark E. Jost; Guy Blalock, all of Boise, Id.

[73] Assignee: Micron Technology, Inc., Boise, Id.

[21] Appl. No.: 08/986,428

[22] Filed: Dec. 8, 1997

[51] Int. Cl.$^7$ .................................................. H01L 21/461
[52] U.S. Cl. .......................... 438/697; 438/720; 438/723; 438/742
[58] Field of Search ..................... 438/626, 631, 438/645, 637, 641, 675, 697, 700, 714, 738

[56] References Cited

U.S. PATENT DOCUMENTS

| | | | |
|---|---|---|---|
| 4,708,767 | 11/1987 | Bril ........................................ | 438/631 |
| 4,824,802 | 4/1989 | Brown et al. ........................... | 438/631 |
| 4,879,257 | 11/1989 | Patrick .................................... | 438/624 |
| 4,917,759 | 4/1990 | Fisher et al. ........................... | 438/625 |
| 5,164,330 | 11/1992 | Davis et al. ............................ | 438/654 |
| 5,260,232 | 11/1993 | Muroyama et al. .................... | 438/672 |
| 5,585,308 | 12/1996 | Sardella ................................. | 438/645 |
| 5,753,547 | 5/1998 | Ying ....................................... | 438/253 |

*Primary Examiner*—Bruce Breneman
*Assistant Examiner*—Allan Olsen

[57] ABSTRACT

A method for removing a surface defect from a dielectric layer during the formation of a semiconductor device comprises the steps of forming a dielectric layer having a hole therein, the dielectric also having a surface defect resulting from a previous manufacturing step such as chemical mechanical polish, contact with another surface during production, or from a manufacturing defect. A blanket conductive layer is then formed within the hole, within the surface defect, and over the dielectric layer. The conductive layer is etched from the surface of the dielectric using an etch which removes the conductive layer at a substantially faster rate than it removes the dielectric. This etch is stopped when the level of conductive material in the plug is flush with the upper surface of the dielectric. Next, the conductive and dielectric layers are etched using a dry or plasma etch which removes the conductive and dielectric layers at about the same rate. This etch continues until the surface defect in the dielectric layer is removed, thereby forming a nonrecessed plug.

24 Claims, 2 Drawing Sheets

METHOD OF REMOVING SURFACE DEFECTS OR OTHER RECESSES DURING THE FORMATION OF A SEMICONDUCTOR DEVICE

FIELD OF THE INVENTION

This invention relates to the field of semiconductor assembly, and more particularly to a method for removing surface defects from oxide or other materials.

BACKGROUND OF THE INVENTION

A structure commonly formed during the manufacture of semiconductor devices such as microprocessors, memory devices, and logic devices includes a plug or stud manufactured from polycrystalline silicon (poly) or metal such as tungsten. For purposes of illustration only, this disclosure discusses the formation of a plug from poly. The plug typically contacts a doped layer in a semiconductor substrate or contacts some other underlying structure. To manufacture the plug, a masked dielectric layer is formed over the underlying structure and an etch is completed to form a hole in the dielectric which exposes the underlying structure to which contact is to be made. A blanket poly layer is deposited over the dielectric layer which fills the hole in the dielectric layer and contacts the underlying structure. The poly is then removed from a planar surface of the dielectric, typically using a chemical mechanical polishing (CMP) process which leaves the plug formed within the dielectric layer.

Ideally, the process described above would leave a poly plug having an upper surface which is flush with the upper level of the dielectric layer. CMP results in a sufficiently-flush plug but it is not a particularly clean or uniform process and, in practice, can damage surface structures. Previous dry etches are cleaner than CMP but can result in a plug having a concave upper surface which is recessed into the dielectric layer. It is difficult to form a reliable electrical connection to a recessed plug with a subsequently formed layer such as metal.

Another problem with the process described above results from surface defects in the dielectric, such as surface scratches, cracks, or other voids or recesses formed during manufacture of the dielectric layer. During conductor formation these surface defects are filled with poly which remains in the void after CMP removal of the poly from the surface of the dielectric. The poly remaining in the voids, also referred to as "stringers," can form a short between other conductive structures such as between two or more plugs or between other structures such as metal lines which are subsequently formed.

A method for forming a conductive plug or stud which reduces or eliminates the problems described above would be desirable.

SUMMARY OF THE INVENTION

The present invention provides a new method that reduces problems associated with the manufacture of semiconductor devices, particularly problems resulting in a concave profile of a conductive plug and resulting in stringers or other undesirable conductive fragments. In accordance with one embodiment of the invention a dielectric layer is formed having a desired hole therein and further having an undesired void therein. A blanket conductive layer is formed over the dielectric layer and a first etch is performed which clears a portion of the conductive layer. The first etch removes the conductive layer at a substantially faster rate than it removes the dielectric layer. Subsequently, a second etch is performed which removes the conductive layer and the dielectric layer at about the same rate. At least a portion of the dielectric layer is removed during this etch to remove the void and any conductive layer within the void.

The first etch quickly clears the conductive layer and ideally stops just as the underlying dielectric layer is exposed. The second etch removes the dielectric layer and the conductive layer ideally at the same rate to form a conductive plug having an upper surface which is flush with an upper surface of the dielectric layer. It would be possible to perform the second etch only and omit the first etch, but the chemistry required for the second etch removes the conductive layer at a much slower rate and thus would decrease manufacturing throughput.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
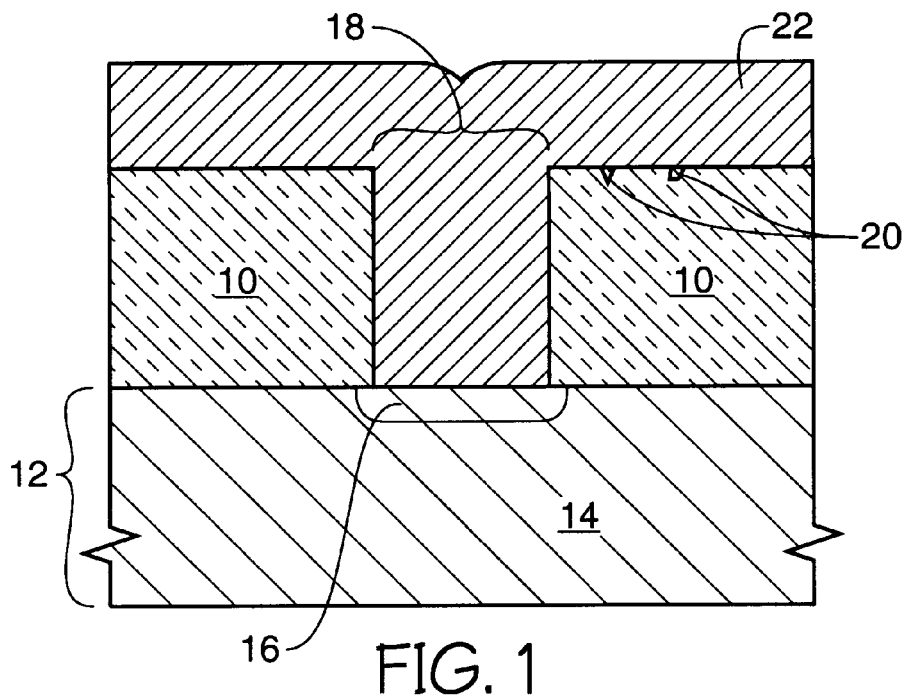
FIG. 1 is a cross section depicting a starting structure for one possible embodiment of the invention to form a conductive plug in a dielectric layer to contact a doped region in a substrate.
Figure 2:
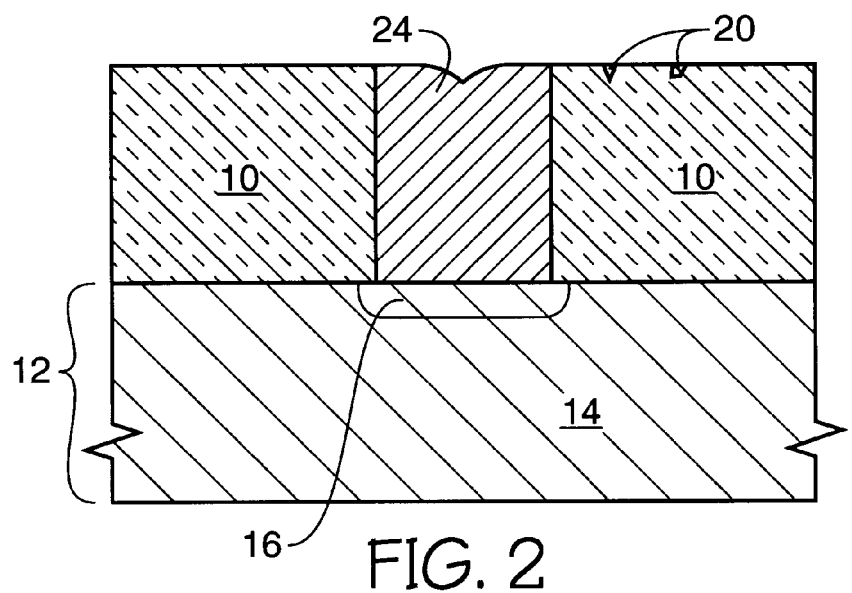
FIG. 2 is a cross section depicting the structure resulting from an etch of a blanket poly layer depicted in FIG. 1.
Figure 3:
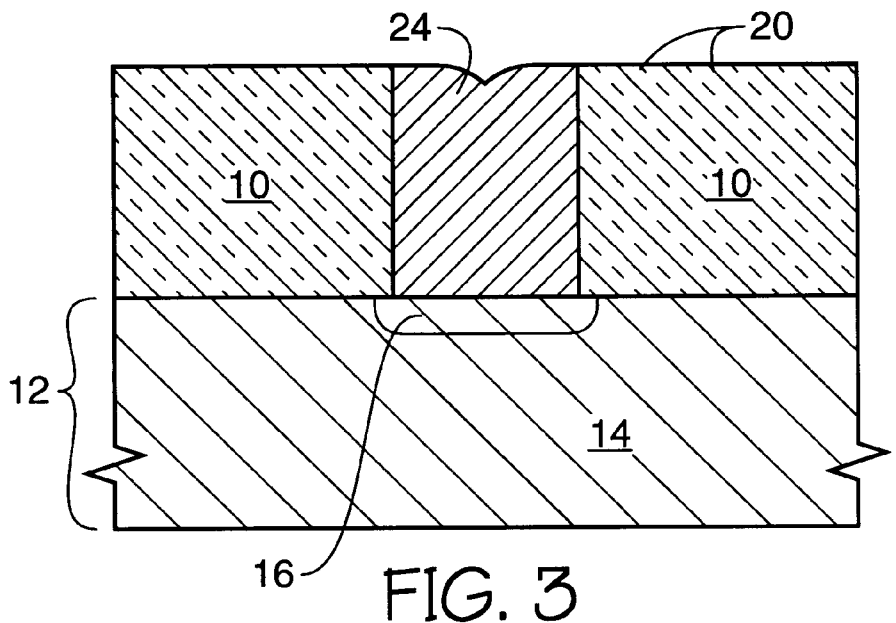
FIG. 3 is a cross section depicting the structure resulting from an etch of the poly layer and the dielectric layer of FIG. 2.

A first embodiment of an inventive method which removes a void from a layer of dielectric material during the formation of a semiconductor device is depicted in FIGS. 1–3. As depicted in FIG. 1 a dielectric layer 10, in this embodiment borophosphosilicate glass (BPSG), is formed over a semiconductor substrate assembly 12. For purposes of illustration only, in this embodiment the assembly comprises a semiconductor substrate 14 having a doped region 16 therein. It should be noted, however, that the semiconductor substrate assembly 12 can comprise any number of structures such as capacitor plates or portions thereof, or conductive lines or other conductive structures. Further, the dielectric layer can comprise any number of oxides or nitrides. In this inventive embodiment the dielectric has a hole 18 therein and further comprises one or more voids 20 in an upper surface. Voids in dielectric are known to occur through previous manufacturing steps such as chemical mechanical polishing, through accidental contact with objects during production, or from manufacturing defects. These surface defects are generally much shallower than other holes or contacts intentionally formed in the dielectric.

FIG. 1 further depicts a blanket conductive layer 22 such as polycrystalline silicon (poly) formed in the hole 18 to contact the doped region 16 in the substrate 14, which also fills the voids 20.

After forming the FIG. 1 structure the conductive layer 22 is etched using an isotropic or an anisotropic etch to result in the structure of FIG. 2. In this embodiment an anisotropic etch is used which etches the conductive layer at a substantially faster rate than it etches the dielectric. One possible etch which removes poly substantially faster than it removes BPSG comprises an environment in an Applied Materials 5000 etcher having a pressure of from 20 to 60 millitorr, (preferably about 25 millitorr), a power of from 150 to 350 watts (preferably about 250 watts), zero to 40 Gauss (preferably about zero Gauss) and a feed gas flow rate comprising 40 to 80 standard cubic centimeters (sccm) $NF_3$ and zero to 15 sccm $Cl_2$ (preferably about 65 sccm $NF_3$ and about 6 sccm $Cl_2$). An etch for a duration of about 60 seconds will remove about 4,200 angstroms (Å) of poly. Another etch selective to the dielectric which would provide adequate uniformity and endpoint control includes the use of an $NF_3$, He, and $O_2$ chemistry. The endpoint of the etch should be called as soon as the poly over the surface of the dielectric begins to clear in order to prevent the plug from over-recessing. In general, once the exposed poly on the surface of the dielectric goes from 100% exposed poly to about 10% or less exposed poly and about 90% or more exposed dielectric, the endpoint should be called.

The etch is ideally timed to produce a conductive plug 24 which is flush with the dielectric 10. Leaving the plug flush, however, leaves conductive material within the voids which can form "stringers" or other conductive fragments and short subsequently formed layers and results in a malfunctioning device. If the conductive layer is over-etched to remove the material from the voids, an undesirable recessed conductive plug is formed which is difficult to connect with subsequent conductive layers.

Next, an etch is performed on the FIG. 2 structure which removes the conductive layer and the dielectric layer simultaneously at about the same rate. This etch removes the stringers 20, a portion of the dielectric 10 including the dielectric comprising the void, and a portion of the plug 24 to result in the FIG. 3 structure. Ideally, the etch will remove the conductive layer and the dielectric layer at a 1:1 ratio, but removal of the two layers at about the same rate is sufficient if the conductive layer is not overly recessed (which could create another recess at the location of the conductive layer) or as long as an inordinate amount of dielectric is not removed relative to the conductive layer (which could result in an inadequate oxide thickness or portions of the conductive layer remaining on the surface of the wafer assembly). The etch rate should be sufficiently close to a 1:1 ratio such that subsequent processing steps are not adversely affected. To ensure removal of the void, the etch can be performed for a sufficient duration to over-etch the void in the dielectric. The actual amount of material removed during this nonselective etch is determined by the depth of the surface defect plus the desired over-etch margin. This is an optimization process determined by yield enhancement data. With typical processing using the inventive method, at least 300Å of dielectric material will be removed although the inventive process may be useful for removing less than 300Å depending on the device being manufactured and the individual use of the invention.

An example of a dry or plasma etch which removes polycrystalline silicon and BPSG at about the same rate comprises an environment in an Applied Materials 5000 etcher having a pressure of from 150 to 250 millitorr (preferably about 200 millitorr), a power of from 650 to 850 watts (preferably about 750 watts), from about zero to 40 Gauss (preferably about zero Gauss), and a feed gas flow rate comprising 40 to 80 sccm $CF_4$, zero to 20 sccm $CHF_3$, and zero to 60 sccm Ar (preferably about 60 sccm $CF_4$, about 12 sccm $CHF_3$, and about 40 sccm Ar). An etch for a duration of about 20 seconds will remove about 1,300Å of BPSG oxide and/or poly.

Figure 4:
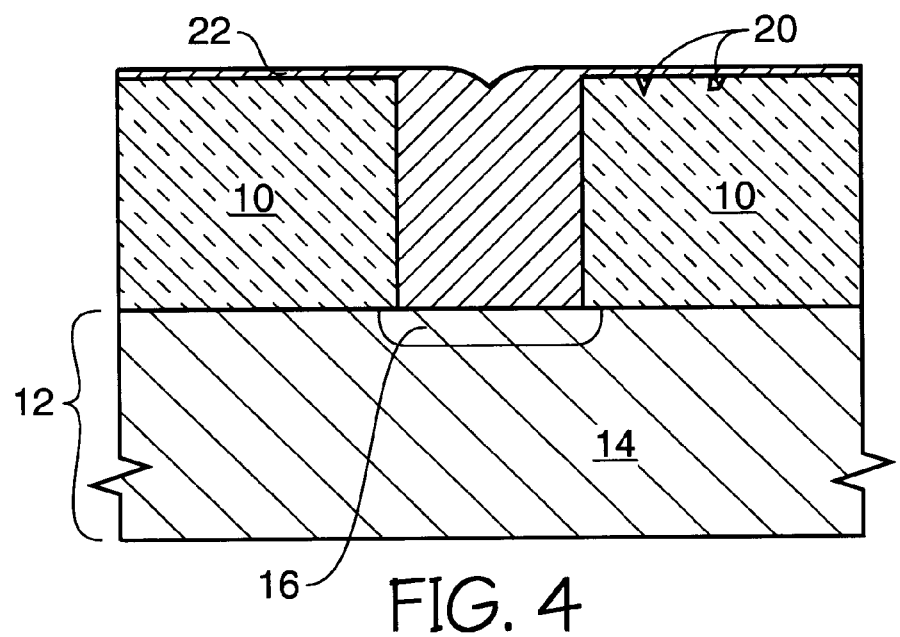
FIG. 4 is a cross section depicting a second embodiment of the invention which results from an etch of the poly layer of FIG. 1.

In another embodiment the conductive layer of FIG. 1 is somewhat underetched during the first etch to result in the structure of FIG. 4. The second etch is then performed on the FIG. 4 structure until the voids in the dielectric and the stringers or other conductive fragments are adequately removed. This embodiment reduces the likelihood of over-etching the conductive plug which would recess the plug during the first etch, yet minimizes the impact on manufacturing throughput.

In yet another embodiment the first etch is omitted and only the etch which etches the conductive layer and dielectric layer at a 1:1 ratio is performed on the FIG. 1 structure. While this etch will minimize recessing the conductive plug within the dielectric layer, throughput will be more greatly affected since the second etch removes the conductive layer more slowly than the first etch.

Finally, nitride may be used instead of the oxide described above. In an embodiment comprising nitride the same first and second etches can be used. The second etch in a nitride embodiment can be optimized for nitride by altering the preferred parameter values away from those listed for oxide, but within the ranges specified. Parameter values close to those preferred in the oxide embodiment would likely yield optimized results.

While this invention has been described with reference to illustrative embodiments, this description is not meant to be construed in a limiting sense. Various modifications of the illustrative embodiments, as well as additional embodiments of the invention will be apparent to persons skilled in the art upon reference to this description. It is therefore contemplated that the appended claims will cover any such modifications or embodiments as fall within the true scope of the invention.

What is claimed is:

1. A method which removes a void from a layer of dielectric material during the formation of a semiconductor device comprising the following steps:

forming a dielectric layer over a semiconductor substrate assembly, said dielectric layer having a surface comprising a void therein;

forming a conductive layer over said dielectric layer, said conductive layer filling said void;

removing at least a portion of said conductive layer and at least a portion of said dielectric layer using a dry etch which removes said conductive layer and said dielectric layer at about the same rate and which removes a sufficient portion of said dielectric layer to remove said void in said dielectric layer, wherein prior to initiating said step of removing said layer portions, said conductive layer has a planar surface.

2. The method of claim 1 wherein said step of removing said layer portions further comprises the step of providing an environment having a pressure of from 150 to 250 millitorr, a power of from 650 to 850 watts, from about zero to 40 Gauss, and a feed gas flow rate comprising 40 to 80 sccm $CF_4$, zero to 20 sccm $CHF_3$, and zero to 60 sccm Ar.

3. The method of claim 2 wherein said step of removing said layer portions is performed for a duration sufficient to over-etch said void in said dielectric.

4. The method of claim 1 wherein said step of removing said layer portions further comprises the step of providing an environment having a pressure of about 200 millitorr, a power of about 750 watts, and a feed gas flow rate comprising about 60 sccm $CF_4$, about 12 sccm $CHF_3$, and about 40 sccm Ar.

5. The method of claim 4 wherein step of removing said layer portions is performed for a duration of about 20 seconds.

6. The method of claim 1 further comprising the steps of:

removing a portion of said conductive layer and leaving a portion of said conductive layer in said void using an etch which removes said conductive layer at a rate substantially faster than it removes said dielectric layer;

subsequent to said step of removing a portion of said conductive layer with said etch which removes said conductive layer at a rate substantially faster than it removes said dielectric layer, performing said step of removing at least a portion of said dielectric layer using said etch which removes said conductive layer and said dielectric layer at about the same rate.

7. The method of claim 6 wherein said step of removing said conductive layer at a rate substantially faster than it removes said dielectric layer comprises the step of providing an environment having a pressure of from 20 to 60 millitorr, a power of from 150 to 350 watts, zero to 40 Gauss, and a feed gas flow rate comprising 40 to 80 sccm $NF_3$ and zero to 15 sccm $Cl_2$.

8. The method of claim 6 wherein said step of removing said conductive layer at a rate substantially faster than it removes said dielectric layer comprises the step of providing an environment having a pressure of about 25 millitorr, a power of about 250 watts, and a feed gas flow rate comprising about 65 sccm $NF_3$ and about 6 sccm $Cl_2$.

9. The method of claim 6 wherein said dielectric layer further comprises a hole therein further comprising the step of filling said hole with said conductive layer during said step of filling said void, wherein at least a portion of said conductive layer in said hole remains after said step of performing said etch which removes said conductive layer and said dielectric layer at about the same rate.

10. The method of claim 9 further comprising the step of contacting said substrate assembly under said dielectric layer with said conductive layer during said step of forming said conductive layer.

11. The method of claim 1 further comprising the step of removing at least 300Å of said dielectric layer during said step of removing said layer portions.

12. A method used during the formation of a semiconductor device comprising the following steps:

forming a dielectric layer having a first recess therein with a first depth and a second recess therein with a second depth wherein said first depth is greater than said second depth;

forming a conductive layer within said first and second recesses;

plasma etching said conductive layer and said dielectric layer using an etch which removes said conductive layer and said dielectric layer at a ratio of about 1:1, wherein said conductive layer, prior to initiating said plasma etching step, has a planar surface.

13. The method of claim 12 further comprising the step of removing a portion of said dielectric during said step of plasma etching thereby completely removing said second recess and said conductive layer within said second recess.

14. The method of claim 12 wherein said step of plasma etching further includes the step of providing an environment having a pressure of from 150 to 250 millitorr, a power of from 650 to 850 watts, from about zero to 40 Gauss, and a feed gas flow rate comprising 40 to 80 sccm $CF_4$, zero to 20 sccm $CHF_3$, and zero to 60 sccm Ar.

15. The method of claim 12 wherein said step of plasma etching further includes the step of providing an environment having a pressure of about 200 millitorr, a power of about 750 watts, and a feed gas flow rate comprising about 60 sccm $CF_4$, about 12 sccm $CHF_3$, and about 40 sccm Ar.

16. The method of claim 12 wherein said step of plasma etching further includes the step of removing at least about 300Å of said dielectric material.

17. A method for removing a surface defect from a dielectric layer during the formation of a semiconductor device comprising the following steps:

forming a dielectric layer having a hole therein and a surface defect therein;

forming a conductive layer within said hole;

removing a portion of said conductive layer and a portion of said dielectric layer using an etch which removes said conductive layer and said dielectric layer at about the same rate, wherein said etch etches said surface defect in said dielectric layer and removes a portion of said conductive layer simultaneously, wherein said dielectric layer and said conductive layer each comprise a substantially planar upper surface prior to initiating said step of removing said layer portions.

18. The method of claim 17 further comprising the following steps:

forming said conductive layer within said surface defect during said step of forming said conductive layer within said hole;

removing said conductive layer within said surface defect and said surface defect during said step of removing said portion of said conductive layer and said portion of said dielectric layer.

19. The method of claim 17 wherein said step of forming said conductive layer further includes forming a blanket conductive layer, further comprising the step of removing a portion of said conductive layer using an etch which etches said conductive layer at a substantially faster rate than it etches said dielectric layer.

20. The method of claim 19 wherein said etch which removes said conductive layer and said dielectric layer at about the same rate further comprises the step of providing an environment having a pressure of from 150 to 250 millitorr, a power of from 650 to 850 watts, from about zero to 40 Gauss, and a feed gas flow rate comprising 40 to 80 sccm $CF_4$, zero to 20 sccm $CHF_3$, and zero to 60 sccm Ar.

21. The method of claim 19 wherein etch which removes said conductive layer and said dielectric layer at about the same rate further comprises the step of providing an environment having a pressure of about 200 millitorr, a power of about 750 watts, and a feed gas flow rate comprising about 60 sccm $CF_4$, about 12 sccm $CHF_3$, and about 40 sccm Ar.

22. The method of claim 19 wherein said etch which etches said conductive layer at a substantially faster rate than it etches said dielectric layer further comprises the step of providing an environment having a pressure of from 20 to 60 millitorr, a power of from 150 to 350 watts, zero to 40 Gauss, and a feed gas flow rate comprising 40 to 80 sccm $NF_3$ and zero to 15 sccm $Cl_2$.

23. The method of claim 19 wherein said etch which etches said conductive layer at a substantially faster rate than it etches said dielectric layer further comprises the step of providing an environment having a pressure of about 25 millitorr, a power of about 250 watts, and a feed gas flow rate comprising about 65 sccm $NF_3$ and about 6 sccm $Cl_2$.

24. The method of claim 17 wherein said step of removing said layer portions further comprises the step of removing at least 300Å of said dielectric layer.

* * * * *